United States Patent
Harada et al.

(10) Patent No.: US 11,937,510 B2
(45) Date of Patent: *Mar. 19, 2024

(54) PIEZOELECTRIC CERAMICS AND THEIR MANUFACTURING METHODS, AND PIEZOELECTRIC DEVICE

(71) Applicant: TAIYO YUDEN CO., LTD., Tokyo (JP)

(72) Inventors: Tomohiro Harada, Tokyo (JP); Yuuhei Ueyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 732 days.

This patent is subject to a terminal disclaimer.

(21) Appl. No.: 17/037,494

(22) Filed: Sep. 29, 2020

(65) Prior Publication Data

US 2021/0119108 A1    Apr. 22, 2021

(30) Foreign Application Priority Data

Oct. 17, 2019 (JP) .................................. 2019-190183

(51) Int. Cl.
| | | |
|---|---|---|
| *H01L 41/187* | (2006.01) | |
| *H01L 41/047* | (2006.01) | |
| *H01L 41/312* | (2013.01) | |
| *H01L 41/43* | (2013.01) | |
| *H10N 30/072* | (2023.01) | |
| *H10N 30/097* | (2023.01) | |

(Continued)

(52) U.S. Cl.
CPC ....... *H10N 30/8536* (2023.02); *H10N 30/072* (2023.02); *H10N 30/097* (2023.02); *H10N 30/871* (2023.02)

(58) Field of Classification Search
CPC .. H10N 30/072; H10N 30/097; H10N 30/871; H10N 30/8536
USPC .......................................................... 310/358
See application file for complete search history.

(56) References Cited

U.S. PATENT DOCUMENTS 7,090,785 B2 * 8/2006 Chiang ................ C01G 49/009
117/948
2008/0061263 A1   3/2008 Kawada et al.
(Continued)

FOREIGN PATENT DOCUMENTS

| | | |
|---|---|---|
| JP | 2004-075449 A | 3/2004 |
| JP | 2006-327863 A | 12/2006 |

(Continued)

OTHER PUBLICATIONS

Japanese Office Action dated Sep. 22, 2023 in a counterpart Japanese patent application No. 2019-190183. (A machine translation (not reviewed for accuracy) attached.).

*Primary Examiner* — Shawki S Ismail
*Assistant Examiner* — Monica Mata
(74) *Attorney, Agent, or Firm* — CHEN YOSHIMURA LLP

(57) ABSTRACT

A piezoelectric ceramic containing no lead as a constituent element is provided. Coefficient of variation C.V. of grain size of grains contained in the piezoelectric ceramic is 35% or less, and an image quality (IQ) image obtained by analyzing a cross section of the piezoelectric ceramic by an electron backscatter diffraction (EBSD) method shows that at least one of the grains has a grain size of 3 μm to 5 μm and an area ratio of a domain in said at least one of the grains is 85% or more.

12 Claims, 4 Drawing Sheets

(51) Int. Cl.
    *H10N 30/853*   (2023.01)
    *H10N 30/87*    (2023.01)

(56)         References Cited

U.S. PATENT DOCUMENTS

2011/0021916  A1   1/2011   Morita
2011/0180623  A1   7/2011   Kawamoto
2013/0221807  A1   8/2013   Shimizu et al.
2019/0044054  A1   2/2019   Watanabe et al.
2019/0237254  A1   8/2019   Sakurai et al.

FOREIGN PATENT DOCUMENTS

JP       2007-153636   A    6/2007
JP       2009-96668    A    5/2009
JP       2009-242161   A   10/2009
JP       2010-052977   A    3/2010
JP       2010-150060   A    7/2010
JP       2012-064674   A    3/2012
JP       2017-092280   A    5/2017
JP       2019-29671    A    2/2019
JP       2019-131438   A    8/2019
JP       2019-134015   A    8/2019
WO       2006/117990   A1  11/2006
WO       2009/113432   A1   9/2009
WO       2010/024277   A1   3/2010

* cited by examiner

3 μm

3 µm

PIEZOELECTRIC CERAMICS AND THEIR MANUFACTURING METHODS, AND PIEZOELECTRIC DEVICE

BACKGROUND OF THE INVENTION

Technical Field

The present invention relates to piezoelectric ceramics, a method for producing the same, and a piezoelectric device.

Background Art

Piezoelectric devices are used in sensor devices, power generation devices, and the like by utilizing the direct piezoelectric effect of converting mechanical energy into electrical energy. Piezoelectric devices are also used in vibrators, sounding bodies, actuators, ultrasonic motors, pumps, etc., by utilizing the inverse piezoelectric effect of converting electrical energy into mechanical energy. Further, the piezoelectric element is also used in a circuit element, a vibration control element, and the like by using a direct piezoelectric effect and an inverse piezoelectric effect in combination.

Lead zirconate titanate (Pb(Zr, Ti)O$_3$, PZT) and its solid solution are widely used as the composition of the piezoelectric ceramic material constituting the piezoelectric device. Although such PZT-based piezoelectric ceramics have excellent piezoelectric characteristics, it contains lead which is a harmful substance, and lead-free piezoelectric ceramics are being developed to replace them.

As an example of the lead-free piezoelectric ceramic composition, a material containing bismuth sodium titanate ((Bi$_{0.5}$Na$_{0.5}$)TiO$_3$, BNT) and barium titanate (BaTiO$_3$, BT) as the main component (BNT-BT type) has been reported (Patent Documents 1 and 2). Patent Document 1 states that the piezoelectric ceramics described in the document have a relatively high electromechanical coupling coefficient kt, a high mechanical quality factor Qm, a high relative permittivity $\varepsilon_{33}^T/\varepsilon_0$, and a high Curie temperature Tc so that it is suitable for high-power ultrasonic application equipment such as bolt-tightened Langevin type ultrasonic vibrators for washing machines and processing machines, and ultrasonic vibrators such as fish finder. Further, Patent Document 2 describes that the piezoelectric ceramics described in the document have a large mechanical quality factor Qm and thus become elastically highly energy-efficient materials, and the application to piezoelectric devices is thereby widened.

Further, as another example of the lead-free piezoelectric ceramic composition, a material containing potassium sodium niobate ((K, Na)NbO$_3$) as a main component has been reported (Patent Document 3). Patent Document 3 describes that the piezoelectric ceramics described in the document have a large mechanical quality factor Qm, and are suitably used for ultrasonic actuators, sensors, filters, transducers, ultrasonic motors and the like.

Further, as yet another example of the piezoelectric ceramic composition containing no lead, a material containing barium calcium titanate zirconate (BCTZ) as a main component has been reported (Patent Document 4). According to Patent Document 4, in a BCTZ-based piezoelectric ceramic containing Mn, a large piezoelectric constant (d$_{31}$) and a large mechanical quality factor (Qm) are both achieved by adjusting the crystal grain size and the domain width to certain specific values, and that the material can be used for an ultrasonic transducer.

RELATED ART DOCUMENT

Patent Documents

Patent Document 1: Japanese Patent Application Laid-Open Publication No. 2006-327863
Patent Document 2: Japanese Patent Application Laid-Open Publication No. 2010-150060
Patent Document 3: Japanese Patent Application Laid-Open Publication No. 2009-96668
Patent Document 4: Japanese Patent Application Laid-Open Publication No. 2019-29671

SUMMARY OF THE INVENTION

Among the piezoelectric devices, the oscillator, the ultrasonic motor, and the like are continuously driven under conditions where a large amplitude occurs such at as a resonance point, and therefore, the device itself tends to generate heat. Since heat generation leads to deterioration and deactivation of piezoelectric characteristics, suppression of the generated heat is the key to practical use of the device. It is known that the heat generated by the piezoelectric element is caused by the mechanical loss and the electrical loss of the piezoelectric ceramics. In piezoelectric ceramics, it is known that the mechanical loss can be reduced by increasing the mechanical quality factor Qm, which is one of the piezoelectric characteristics, and electrical loss can be reduced by lowering the dissipation factor (dielectric loss tangent) tan δ. Therefore, piezoelectric ceramics used for vibrators, ultrasonic motors, etc. are required to have a large mechanical quality factor Qm and a small dielectric loss tangent tan δ.

In Patent Documents 2 and 3, in order to obtain lead-free piezoelectric ceramics having a large mechanical quality factor Qm, and in Patent Document 1, in order to obtain lead-free piezoelectric ceramics having a small dielectric loss tangent tan δ, various compositions are studied, achieving a certain degree of success. However, from the practical point of view of the ultrasonic vibrator, further improvement of the characteristics of the piezoelectric ceramics is required.

In Patent Document 4, the grain size and the domain width are examined in addition to the composition of the lead-free piezoelectric ceramics, and a large mechanical quality factor Qm is achieved, but it has not been confirmed whether the dielectric loss tangent tan δ is small. Further, in that technique, in order to realize a large piezoelectric constant and a large mechanical quality factor, a two-step poling process is performed during manufacturing, which is a disadvantageous in that the number of steps required for manufacturing is large.

Therefore, an object of the present invention is to provide a lead-free piezoelectric ceramics having an improved dielectric loss tangent tan δ while maintaining the mechanical quality factor Qm.

The present inventors have conducted various studies in order to solve the above problems. As a result, it was found that the problems can be solved by, with respect to sintered grains constituting the piezoelectric ceramics, reducing the variation coefficient C. V. and increasing the domain size in grains having a relatively large grain size.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings. To achieve these and other advantages and in accordance with the purpose of the present invention, as embodied and broadly described, in one aspect, the present disclosure provides a piezoelectric ceramic containing no lead as a constituent element, wherein coefficient of variation C.V. of grain size of grains contained in the piezoelectric ceramic is 35% or less, and wherein an image quality (IQ) image obtained by analyzing a cross section of the piezoelectric ceramic by an electron backscatter diffraction (EBSD) method shows that at least one of the grains has a grain size of 3 µm to 5 µm and an area ratio of a domain in said at least one of the grains is 85% or more.

In another aspect, the present disclosure provides a method for manufacturing a piezoelectric ceramic containing no lead as a constituent element, comprising: mixing predetermined amounts of raw material powders to obtain a mixed powder; pre-firing the mixed power to obtain a pre-fired powder; molding the pre-fired powder to obtain a molded body; firing the molded body to obtain a sintered body; and performing a poling treatment on the sintered body, wherein among said raw material powders, one that is used the most in amount in terms of mol has a specific surface area of 10 m²/g or more.

In another aspect, the present disclosure provides a piezoelectric device comprising the above-mentioned piezoelectric ceramic and electrodes electrically connected to the piezoelectric ceramic.

According to the present invention, it is possible to provide a lead-free piezoelectric ceramic having an improved dielectric loss tangent tan δ while maintaining a sufficient mechanical quality factor Qm.

It is to be understood that both the foregoing general description and the following detailed description are exemplary and explanatory, and are intended to provide further explanation of the invention as claimed.

DETAILED DESCRIPTION OF EMBODIMENTS

Figure 1:
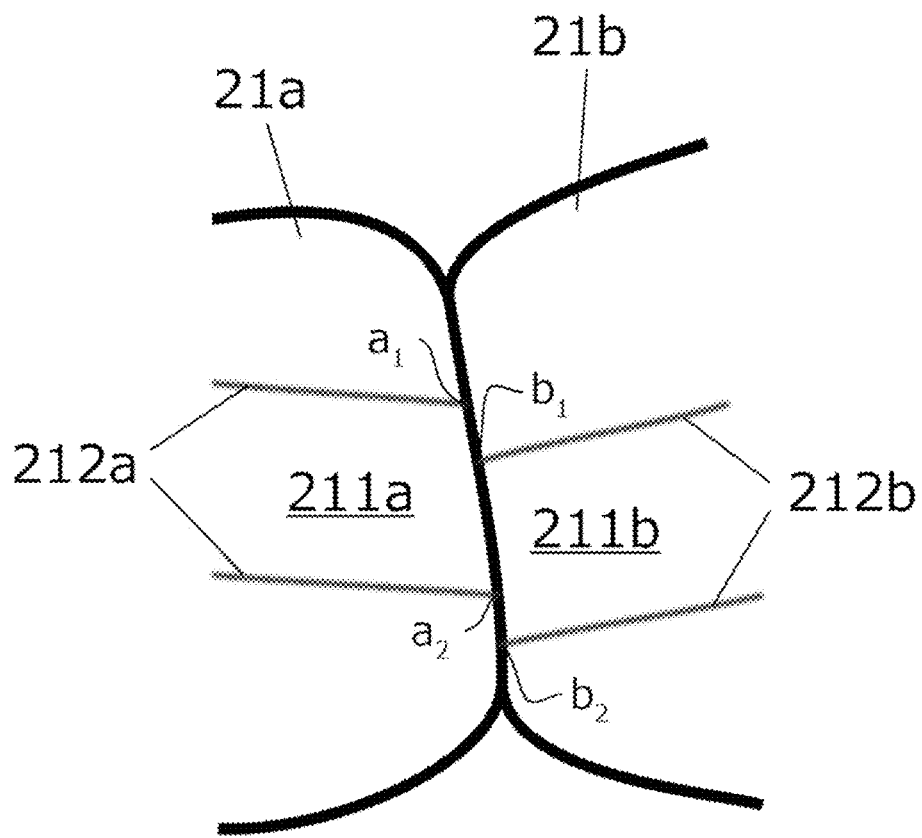
FIG. 1 is an explanatory diagram showing a domain observed across a plurality of grains.

Hereinafter, configurations and operational effects of the present invention will be described together with technical ideas with reference to the drawings. However, the below-described functional mechanisms include estimation, and the accuracy thereof does not limit the scope of the present invention. Further, among the constituent elements in the following embodiments, constituent elements that are not recited in the broadest independent claims should be regarded as optional elements. It should also be noted that the description of the numerical range (the description in which two numerical values are connected by "-" or "to") includes the numerical values respectively setting forth the lower limit and the upper limit.

<Piezoelectric Ceramics>

A piezoelectric ceramic according to an embodiment of the present invention (hereinafter, may be simply referred to as "first embodiment") does not contain lead as a constituent element, and the coefficient of variation C. V. of the grain size of the contained grains is 35% or less, and in the image quality (IQ) image obtained by analyzing a cross-section of the piezoelectric ceramic by an electron backscatter diffraction (EBSD) method, in at least one of the grains being observed, the grain size is observed to be 3 µm to 5 µm, and an area ratio of a domain is observed to be 85% or more. In this specification, "piezoelectric ceramics" is used as a term meaning ceramics (sintered bodies) exhibiting piezoelectricity, and also includes a portion between electrodes in a piezoelectric device having electrodes sandwiching such a piezoelectric ceramic.

Since the first embodiment does not contain lead as a constituent element, the environmental impact can be reduced. In the present specification, the phrase "lead is not included as a constituent element" and similar expressions mean that lead is not designed to be or intentionally introduced on top of lead that is inevitably contained in raw materials and lead inevitably mixed in the manufacturing process.

In the first embodiment, the coefficient of variation C.V. of the grain size of the contained grains is 35% or less. By reducing the C.V. of the grain size, the fine structure becomes more uniform and the dielectric loss tangent tan δ decreases. The coefficient of variation C.V. is more preferably 32% or less, and even more preferably 30% or less.

The average grain diameter $r_{avg}$ of the grains contained in the first embodiment is not particularly limited, but is preferably 3 µm or more. By setting the average grain size $r_{avg}$ to 3 µm or more, a high mechanical quality factor Qm can be obtained when the piezoelectric device is made. The average grain diameter $r_{avg}$ is more preferably 3.5 µm or more. The upper limit of the average grain size $r_{avg}$ is not particularly limited, but is preferably 10 µm or less from the viewpoint of suppressing a decrease in mechanical strength due to coarse grains.

Here, the average grain size $r_{avg}$ and the coefficient of variation C.V. is determined by the following procedure.

First, platinum is vapor-deposited on a surface of the piezoelectric ceramic to provide conductivity, and used as a measurement sample.

Then, the measurement sample is observed with a scanning electron microscope (SEM), and 4 to 6 photographs are taken at a magnification at which about 60 to 200 grains are included in the visual field.

Then, the captured photographs are each subjected to an image processing to obtain the area of each grain shown in the photograph, and the equivalent circle diameter $r_i$, which is the diameter of the circle having the same area, is calculated as the grain size.

Next, the average grain diameter $r_{avg}$ is calculated by the following formula (1) from the obtained equivalent circle diameter $r_i$ of each grain and the number n of the grains for which the equivalent circle diameter was calculated, and the result of the calculation is regarded as the average grain diameter $r_{avg}$ of the piezoelectric ceramic.

Then, the standard deviation s of the grain size is calculated from the obtained value of the average grain size $r_{avg}$ by the following formula (2).

Finally, from the values of the calculated average grain diameter $r_{avg}$ and the standard deviation s, the coefficient of variation C.V. is calculated by the following formula (3), and the result of the calculation is regarded as the coefficient of variation C.V. of grain size in the piezoelectric ceramic.

Formula 1

$$r_{avg} = \frac{1}{n}\sum_{i=1}^{n} r_i \quad (1)$$

Formula 2

$$s = \sqrt{\frac{\sum_{i=1}^{2} r_i^2 - n(r_{avg})^2}{n-1}} \quad (2)$$

Formula 3

$$C.V. = \frac{s}{r_{avg}} \quad (3)$$

When the above-described surface observation of the piezoelectric ceramic is performed on a polished surface, the contours of the grains may be difficult to see due to removal of a part of the surface of the piezoelectric ceramic. In such a case, it is advisable to perform a heat treatment (thermal etching) at a temperature of 900° C. to 960° C. for about 15 to 30 minutes prior to carrying out the above procedure.

In the first embodiment, in the image quality (IQ) image obtained by analyzing the cross section of the piezoelectric ceramic by the backscattering electron diffraction (EBSD) method, grains in which the grain size is 3 μm to 5 μm, and the area ratio of a domain in the grain is 85% or more are observed. The grain diameter here means the equivalent circle diameter $r_i$ described above. In piezoelectric ceramics, the fact that grains having a large area ratio of domains is confirmed suggests that a large domain exists in the grains. As described above, in the first embodiment in which the piezoelectric ceramic have relatively uniform grain diameters, the presence of large domains in the grains having a relatively large grain diameter achieves a low dielectric loss tangent tan δ. The area ratio of the domain occupied in the grain is preferably as large as possible from the viewpoint of reducing the dielectric loss tangent tan δ. Specifically, the area ratio is more preferably 87% or more, and even more preferably 90% or more.

It is sufficient if one grain having the above-mentioned domain area ratio is confirmed in the piezoelectric ceramic. This is because in the first embodiment, the coefficient of variation C.V. of the grain size of the contained grains is small and the homogeneity of the fine structure is high. Therefore, during the poling treatment, the variation in electric field in respective grains and the variation in response of ions and electrons under the electric field are both suppressed to be small, and as a result, there are many grains having similar domain structure. The number or the ratio of the grains having a grain size of 3 μm to 5 μm and having the above-described area ratio of the domains present in the piezoelectric ceramic is preferably large in terms of reduction in tan δ. As an example, it is more preferable that a 10 μm×10 μm region exists in a cross section of the piezoelectric ceramic in which two or more such grains are present, and it is still more preferable that a 10 μm×10 μm region exits in which three or more of such grains are present.

Here, the observation of the domain and the calculation of the area ratio in the grains in the first embodiment are performed by the following procedure.

First, the piezoelectric ceramic is cut in the polarization direction. When the piezoelectric ceramic forms a piezoelectric device, the polarization direction is usually the direction perpendicular to the electrode surface, but in the case of a piezoelectric device or the like that utilizes thickness shear mode vibrations, caution is required because the polarization direction is different from this. The cutting means is not particularly limited, and a dicing saw, a cutter, or the like can be used.

Next, the cut piezoelectric ceramic is embedded in an epoxy resin such that the cut surface is exposed, and then the cut surface is mirror-polished using colloidal silica.

Next, in order to impart conductivity to the cut surface of the piezoelectric ceramic, the polished surface is coated with osmium (Os) so as to prepare a sample for measurement.

Next, the obtained measurement sample is subjected to measurement by a scanning electron microscope (SEM) (Carl Zeiss, SUPRA40VP) equipped with an EBSD (electron backscatter diffraction) detector (Hikari Speed EBSD Detector, manufactured by EDAX). In the measurement, an electron beam is irradiated in steps of 0.075 μm to obtain a backscattered electron (BSE) image in a rectangular or square region having a side of about 10 μm to 20 μm, and then a portion of the BSE image that contains a large number of grains having the grain size of 3 μm to 5 μm is magnified and irradiated with an electron beam in 0.025 μm steps so as to obtain an image quality (IQ) image by an EBSD detector as an image file.

Next, the image file of the obtained IQ image is saved in the PDF format, and then the PDF file is opened in Adobe Acrobat (made by Adobe). Then, in the "measurement tool" which is one of the standard functions of the software, the "area tool" is selected as the measurement type, and for each of a grain having a grain size of 3 μm to 5 μm observed in the IQ image, for each domain observed as a whitish part inside such a grain, and for domain walls observed as a dark (blackish) part inside such grains, polygons is drawn by tracing the respective outlines. Then, based on the obtained areas of these polygons, the area ratio of the domain in the grain is calculated. The first decimal place of the area ratio expressed in terms of a percentage (%) is rounded off to obtain the "area ratio of the domain in the grain."

In the first embodiment, it is preferable that the domain is observed across (in other words, straddles) a plurality of grains. Here, "the domain straddles a plurality of grains" means that, as shown in FIG. 1, when the domain is observed by the procedure described above, with respect to adjacent grains 21a and 21b, when the points where the domain walls 212a and 212a seen on one side contact the boundary between the grains are $a_1$ and $a_2$, and the points where the domain walls 212b and 212b seen on the other side contact the boundary between the grains are $b_1$ and $b_2$, respectively, $a_1$-$b_1$ distance and $a_2$-$b_2$ distance are both 15% or less of the $a_1$-$a_2$ distance and the $b_1$-$b_2$ distance, which are the domain widths. When the ceramic has such domain across a plurality of grains, the domain size is larger and an even lower dielectric loss tangent tan δ can be achieved.

The first embodiment preferably has a perovskite compound represented by a composition formula $(Bi_{0.5-x/2}Na_{0.5-x/2}Ba_x)(Ti_{1-y}Mn_y)O_3$ (where 0.01≤x≤0.25, and 0.001≤y≤0.020), as its main component. With this, a high mechanical quality factor Qm can be obtained. Here, the "main component" in the present specification means a component contained the most in the piezoelectric ceramic on a mass basis.

In the above composition formula, the value of x, that is, the content ratio of Ba is 0.01 to 0.25. By setting the value of x in this range, both excellent piezoelectric characteristics and high Curie temperature can be achieved.

In the above composition formula, the value of y, that is, the content ratio of Mn is 0.001 to 0.020. By setting the Mn content to 0.001 or more, a high mechanical quality factor Qm can be obtained. The value of y is more preferably 0.005 or more, and even more preferably 0.0075 or more. On the other hand, when the Mn content is 0.020 or less, the formation of Mn-rich deposits can be suppressed, and deterioration of the piezoelectric characteristics can be prevented.

The first embodiment may contain other additive elements or compounds as long as the main component is a perovskite compound satisfying the above-mentioned composition formula. Examples of such additive elements include: Li, K, Ca, Sr or the like, to be substituted for Bi, Na or Ba; Nb, Ta, Zr, Fe, Zn, or the like, to be substituted for Ti; and F or the like, to be substituted for O. Examples of the possible additive compounds include a glassy grain boundary phase created due to a component that is added to lower the sintering temperature.

Here, the fact that the first embodiment contains the perovskite compound represented by the above-mentioned composition formula as a main component is confirmed (determined) by confirming, with respect to a powder obtained by crushing the piezoelectric ceramic, that the diffraction line profile measured by an X-ray diffractometer (XRD) using Cu—Kα rays shows that the ratio of the strongest diffraction line intensity in the diffraction profile due to another structure to the strongest diffraction line intensity in the diffraction profile due to the perovskite structure is 10% or less, and by confirming that the content ratios of the respective elements, as measured by an inductively coupled plasma emission spectroscopic analysis (ICP), an ion chromatography device, or a fluorescent X-ray analyzer (XRF), are within the ratios as represented by the above-described composition formula.

<Manufacturing Method of Piezoelectric Ceramics>

A method for producing piezoelectric ceramics according to an embodiment of the present invention (hereinafter, may simply be referred to as "second embodiment") is for producing a piezoelectric ceramic that does not contain lead as a constituent element, and includes: mixing predetermined amounts of raw material powders to obtain a mixed powder; pre-firing the mixed power to obtain a pre-fired powder; molding the pre-fired powder to obtain a molded body; firing the molded body to obtain a sintered body; and performing a poling treatment on the sintered body, wherein among said raw material powders, one that is used the most in amount in terms of mol has a specific surface area of 10 $m^2/g$ or more.

The powder used as a raw material in the second embodiment is not particularly limited as long as it is a powder of a constituent element of the piezoelectric ceramic (sintered body) or a compound containing such an element. The compound constituting the raw material powder may contain a plurality of kinds of constituent elements of the piezoelectric ceramic, and/or may contain additives other than these elements.

In the second embodiment, a powder having a specific surface area of 10 $m^2/g$ or more is used as the raw material powder that is used the most in terms of mol (hereinafter, referred to as "main raw material powder"). As a result, in the obtained piezoelectric ceramic, it is possible to suppress variations in the grain size of the grains constituting the piezoelectric ceramic and reduce the dielectric loss tangent tan δ. The specific surface area is more preferably 15 $m^2/g$ or more, more preferably 20 $m^2/g$ or more, and even more preferably 25 $m^2/g$ or more.

The mechanism by which piezoelectric ceramic with a small dielectric loss tangent tan δ can be obtained by using a main raw material powder having a large specific surface area is not clear, but the fact that the contact area between the main raw material powder and other raw material powders in the mixed powder becomes large is considered to have some effects. In a mixed powder of the raw materials, the particles of the main raw material powder and the particles of other raw material powders are in contact with each other, and by pre-firing the mixed power, reactions between the constituent elements at the contact points, or reactions after diffusion and migration of the constituent elements through the contact points into other particles occur and produce a compound with a certain composition. In this process, if the contact area between dissimilar particles is small, the diffusion/movement distance of the constituent elements is inevitably long, and it is considered that because of this, the pre-fired powder obtained by pre-firing contains a large number of particles having non-uniform compositions and structural defects. It is considered that due to such non-uniformity of composition and structural defects, the driving force for grain growth generated during the main firing becomes locally different, and that non-uniform grain size in the resulting piezoelectric ceramic occurs. In contrast, it is considered that when the contact area between the main raw material powder and the other raw material powders in the mixed powder is large as in the second embodiment of the present invention, the total moving distance of the constituent elements that diffuse and move in the particles during pre-firing is shorter, and because of it, a pre-fired powder with less non-uniform composition and less structural defects can be obtained. Therefore, it is considered that as a result, a driving force for grain growth during the main firing is uniform, and a piezoelectric ceramic having a small variation in grain size can be obtained.

Here, the specific surface area of the main raw material powder is measured and calculated by a fully automatic specific surface area measuring device using a nitrogen gas adsorption method. First, after degassing the measurement sample in a heater, the amount of adsorbed nitrogen is measured by adsorbing and desorbing nitrogen gas on the measurement sample. Next, the amount of adsorbed monolayer was calculated from the obtained amount of adsorbed nitrogen using the single point BET method, and the surface area of the sample was derived from this value using the value of the area occupied by one nitrogen molecule and Avogadro's number. Finally, the specific surface area of the powder is obtained by dividing the surface area of the obtained sample by the mass of the sample. If the specific surface area of the main raw material powder to be used is listed in a catalog or the like, the listed value may be adopted.

The specific surface area of the raw material powders other than the main raw material powder is not particularly limited, but in a system having a large driving force for grain growth during the main firing, from the perspective of suppressing formation of coarse grains and the resulting decrease in mechanical strength of the piezoelectric ceramic, it is preferably 9.0 $m^2/g$ or less, and more preferably 7.0 $m^2/g$ or less.

The method of mixing the raw materials is not particularly limited as long as each powder is uniformly mixed while preventing the mixture of impurities, and either dry mixing or wet mixing may be adopted. When wet mixing using a ball mill is adopted, it may be mixed for about 8 to 24 hours, for example.

The pre-firing conditions are not limited as long as each raw material reacts to produce a pre-fired powder containing a perovskite compound represented by the above composition formula as a main component. For example, the conditions may be in an air atmosphere, at a temperature of 700° C. to 1000° C. for a duration of 2 to 8 hours. If the firing temperature is too low or the firing time is too short, unreacted raw materials and intermediate products may remain. On the other hand, if the firing temperature is too high or the firing time is too long, there is a risk that the compound with the desired composition cannot be obtained due to the volatilization of the components, and/or the product will solidify and become difficult to crush, degrading the productivity.

As a method for molding the pre-fired powder, a method usually used for molding ceramic powder, such as uniaxial pressure molding of powder, extrusion molding of clay containing powder, or casting molding of a slurry in which powder is dispersed, may be adopted. The molding method for forming a laminate-type (multilayer) piezoelectric device will be described below when the manufacturing method of the corresponding device is explained.

The firing conditions of the molded product are not limited as long as dense piezoelectric ceramics can be obtained, and may be, for example, 1 hour to 5 hours at a temperature of 900° C. to 1200° C. in an air atmosphere. If the firing temperature is too low or the firing time is too short, there is a risk that piezoelectric ceramics with the desired characteristics cannot be obtained due to insufficient densification. On the other hand, if the firing temperature is too high or the firing time is too long, the composition may shift due to the volatilization of the components, or the characteristics may deteriorate due to the formation of coarse grains. The upper limit of the firing temperature is preferably 1100° C. from the viewpoint of suppressing the volatilization of the components during firing and the formation of coarse grains.

In the second embodiment, the sintered body obtained by firing undergoes a poling treatment. The poling treatment is typically performed by forming a pair of electrodes with a conductive material on surfaces of the sintered body and applying a high voltage between the electrodes.

For the formation of the electrodes, a commonly used method, such as a method of applying or printing a paste containing the electrode material on the surfaces of the sintered body and baking it, or a method of depositing the electrode material on the surface of the sintered body by vapor deposition can be adopted. The electrode material is not particularly limited as long as it has a high conductivity and is physically and chemically stable under the poling process conditions. Further, when the thus formed electrodes are also used as electrodes of the piezoelectric device after the poling treatment, they are also required to be physically and chemically stable under the usage environment of the piezoelectric device. Examples of electrode materials that can be used include silver (Ag), copper (Cu), gold (Au), platinum (Pt), palladium (Pd) and nickel (Ni), and alloys thereof.

The conditions for the poling treatment are not particularly limited as long as the directions of spontaneous polarization can be aligned without causing damage such as cracks in the piezoelectric ceramics. As an example, an electric field of 4 kV/mm to 6 kV/mm may be applied at a temperature of 100° C. to 150° C.

In the second embodiment, preferably, the raw material powders and production conditions are selected so as to obtain a sintered body containing the perovskite compound represented by the composition formula $(Bi_{0.5-x/2}Na_{0.5-x/2}Ba_x)(Ti_{1-y}Mn_y)O_3$ (where $0.01 \leq x \leq 0.25$, and $0.001 \leq y \leq 0.020$) as a main component. In this case, in addition to the obtained piezoelectric ceramics exhibiting high piezoelectric characteristics, particularly high mechanical quality factor Qm, there is an advantage that $TiO_2$, which is easily available as a powder having a large specific surface area, can be used as the main raw material powder.

In this case, examples of other raw material powders that can be used include bismuth oxide $(Bi_2O_3)$ or bismuth oxychloride (BiOCl) as the bismuth compound, sodium carbonate $(Na_2CO_3)$ or sodium hydrogencarbonate $(NaHCO_3)$ as the sodium compound, barium carbonate $(BaCO_3)$ as the barium compound, and manganese carbonate $(MnCO_3)$ as the manganese compound.

<Piezoelectric Device>

The piezoelectric ceramic according to the first embodiment and the piezoelectric ceramic obtained by the second embodiment can form a piezoelectric device when equipped with electrodes having a desired shape on the surfaces thereof. The electrode forming may be performed in a method similar to that used at the time of the poling treatment described above. Depending on the vibration mode to be used in the resulting device, the electrodes formed for the poling treatment may be used as is as the electrodes of the piezoelectric device. On the other hand, in a piezoelectric device or the like that utilizes thickness shear mode vibration, the polarization direction in the poling treatment and the voltage application direction during driving of the resulting device are different. Therefore, in such a case, a new set of driving electrodes need to be formed on the surfaces of the piezoelectric ceramic.

<Multilayer Piezoelectric Device>

The piezoelectric device made of the piezoelectric ceramic of the first and/or second embodiments may be a multilayer piezoelectric device. The structure of the multilayer piezoelectric device will be described below with reference to FIGS. 2A and 2B.

Figure 2A:
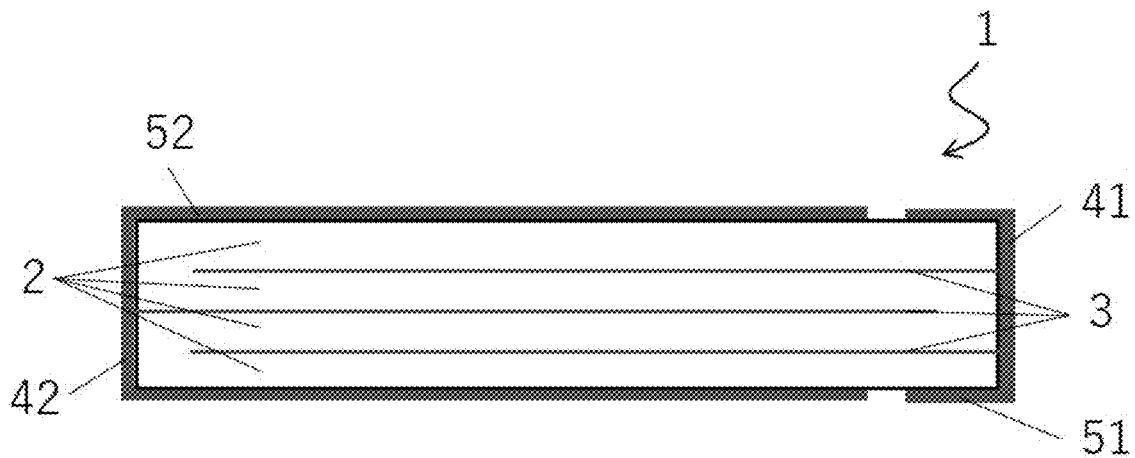
FIGS. 2A and 2B are respectively a front view and a perspective view of a multilayer piezoelectric device.
Figure 2B:
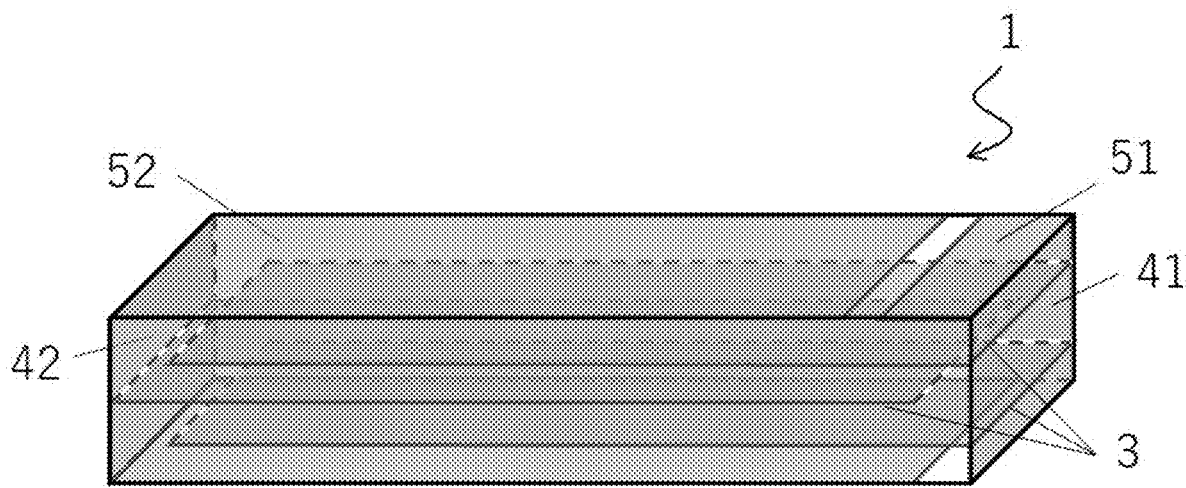

A multilayer piezoelectric device 1 schematically shown in FIGS. 2A and 2B includes: a laminated body in which piezoelectric ceramic layers 2 and internal electrode layers 3 are alternately laminated; a pair of connecting conductors 41 and 42 respectively connected to the internal electrode layers 3 every other layer; and surface electrodes 51 and 52 provided on surfaces of the laminated body and electrically connected to the pair of connecting conductors, respectively. In the drawing, in order to make it easy to grasp the position of the internal electrode layers 3, a structure is shown such that portions of the internal electrode layer 3 that are not connected to the connecting conductors 41 and 42 are also exposed on faces of the device, but the device structure is not limited to this, and it is possible to adopt a structure in which the portions of the internal electrode layers 3 that are not connected to the connecting conductors 41 and 42 are not exposed to faces of the device.

Since the piezoelectric ceramic layers 2 are formed of the above-mentioned piezoelectric ceramics, the description thereof will be omitted.

The internal electrode layers 3 are alternately laminated with the piezoelectric ceramic layers 2, and two different types of electrode patterns are alternately laminated every other layer to form a basic laminated structure of the multilayer piezoelectric device 1.

The electrode material constituting the internal electrode layers 3 are not particularly limited as long as it is a material having a high conductivity and being physically and chemically stable under the usage environment of the multilayer piezoelectric device 1. If the piezoelectric ceramic layers 2 and the internal electrode layers 3 are to be fired together (which will be described below) during the manufacture of the multilayer piezoelectric device 1, it is also necessary that the electrode material be physically and chemically stable at the firing temperature and atmosphere. Examples of such electrode materials that can be used include silver (Ag), copper (Cu), gold (Au), platinum (Pt), palladium (Pd) and nickel (Ni), and alloys thereof.

The connecting conductors 41 and 42 are electrically connected to the internal electrode layers 3 every other layer. That is, the connecting conductor 41 is electrically connected to the odd-numbered internal electrode layers 3 counting from the top, and the connecting conductor 42 is electrically connected to the even-numbered internal electrode layers 3 counting from the top. The odd-numbered and even-numbered electrical connections may be interchanged. Further, in FIGS. 2A and 2B, the connecting conductors 41 and 42 are connected to the exposed portion of the internal electrode layers 3 at the end faces of the multilayer piezoelectric device 1, but the connection mode between the connecting conductors 41 and 42 and the internal electrode layer 3 is not limited to this. For example, they may be connected by through holes (vias) penetrating the piezoelectric ceramic layers 2.

The materials constituting the connecting conductors 41 and 42 are not particularly limited as long as they have a high conductivity and physically and chemically stable in the usage environment of the multilayer piezoelectric device 1. If the connecting conductors 41 and 42 are formed by firing them together with the piezoelectric ceramic layers 2 as in the case of the internal electrode layers 3, they also need to be physically and chemically stable at the firing temperature and atmosphere. Examples of electrode materials that can be used include silver (Ag), copper (Cu), gold (Au), platinum (Pt), palladium (Pd) and nickel (Ni), and alloys thereof. The electrode materials constituting the connecting conductors 41 and 42 may be the same as or different from the electrode materials constituting the internal electrode layers 3.

The surface electrodes 51 and 52 are provided on the surfaces of the multilayer piezoelectric device 1 and are electrically connected to the connecting conductors 41 and 42, respectively. When the connection conductors 41 and 42 described above are also provided on the surfaces of the multilayer piezoelectric device 1, the connection conductors 41 and 42 can also serve as the surface electrodes 51 and 52.

The electrode materials constituting the surface electrodes 51 and 52 are not particularly limited as long as they have a high conductivity and are physically and chemically stable in the usage environment of the multilayer piezoelectric device 1. Examples of electrode materials that can be used include silver (Ag), copper (Cu), gold (Au), platinum (Pt), palladium (Pd) and nickel (Ni), and alloys thereof. The electrode materials constituting the surface electrodes 51 and 52 may be the same as or different from the electrode materials constituting the internal electrode layer 3 and the connecting conductors 41 and 42.

<Manufacture Method of Multilayer Piezoelectric Device>

A generally-known method for manufacturing a laminated or multilayer device can be adopted for manufacturing the above-mentioned multilayer piezoelectric device 1. As an example, a method in which the piezoelectric ceramic layers 2 and the internal electrode layers 3 are fired together will be described below.

First, the pre-fired powder for forming the piezoelectric ceramic layers 2 is mixed with a binder or the like to form a slurry or clay, which is then molded into sheets to obtain green sheets containing the pre-fired powder. As a sheet molding method, a commonly used method such as a doctor blade method or an extrusion molding method can be adopted.

If the multilayer piezoelectric element 1 in which the internal electrode layers 3 and the connecting conductors 41 and 42 are connected by through holes (vias) as described above is to be manufactured, corresponding through holes are formed in the sheet by punching or irradiation of laser light.

Next, an electrode pattern that becomes the internal electrode layer 3 after firing is formed on the green sheet containing the pre-fired powder. The electrode patterns may be formed by a conventional method, and a method of printing or applying a paste containing an electrode material is preferable in terms of cost. When forming electrode patterns by printing or coating, in order to improve the adhesion strength to the piezoelectric ceramic layers 2 after firing, glass frit or pre-fired powder for the piezoelectric ceramic (the same material as for the ceramic layer) may be included in the paste.

In the case of manufacturing the multilayer piezoelectric device 1 in which the internal electrode layers 3 and the connecting conductors 41 and 42 are connected by through holes (vias) as described above, immediately after (or before) the formation of the electrode patterns, the electrode materials, which will become the connecting conductors 41 and 42 after firing, are filled in the through holes formed in the green sheet. The filling method is not particularly limited, but a method of printing a paste containing the electrode material is preferable in terms of cost.

Next, a predetermined number of green sheets having an electrode pattern formed thereon are laminated, and the sheets are adhered to each other to obtain a laminated green body. The lamination and bonding may be performed by a conventional method, and a method of thermocompression bonding the green sheets to each other by the action of a binder is preferable in terms of cost.

Next, the binder is removed from the laminated green body and fired. The removal of the binder and the firing may be continuously performed using the same firing apparatus. The conditions for removing the binder and firing may be appropriately set in consideration of the volatilization temperature and content of the binder, the sinterability of the pre-fired powder, the durability of the internal electrode material, and the like. When copper (Cu) or nickel (Ni) is used as the internal electrode material, it is preferable to perform the firing in a reducing or inert atmosphere in order to prevent oxidation of the internal electrodes. Examples of firing conditions when the internal electrode material does not contain either copper (Cu) or nickel (Ni) is, for example, 1 hour to 5 hours at 900° C. to 1200° C. in an air atmosphere. The firing temperature is preferably 1100° C. or lower from the viewpoint of reducing the material cost by using a material having a low melting point as the electrode material constituting the internal electrode layers. When a plurality of piezoelectric elements are obtained from a single laminated green body, the laminated green body may be divided into several blocks prior to firing.

When the connecting conductors 41 and 42 are provided on the surfaces of the multilayer piezoelectric device 1, the connecting conductors 41 and 42 are formed on the end faces of the fired body after firing so as to be connected to the internal electrode layers 3 exposed on the end faces. Further, surface electrodes 51 and 52 are formed on the surfaces of the laminated body after firing. The connecting conductors 41, 42 and/or the surface electrodes 51, 52 may be formed by a conventional method, and in addition to the method of printing or applying a paste containing the electrode material and baking, vapor deposition may be used.

After forming the connecting conductors 41, 42 and/or the surface electrodes 51, 52, a poling treatment is performed under the above-mentioned conditions to produce the multilayer piezoelectric device 1.

Working Example

Hereinafter, the present invention will be described in more detail with reference to a Working Example, but the present invention is not limited to the Working Example.

<Manufacture of Piezoelectric Ceramic>

High-purity bismuth oxide ($Bi_2O_3$), sodium carbonate ($Na_2CO_3$), barium carbonate ($BaCO_3$), titanium oxide ($TiO_2$), and manganese carbonate ($MnCO_3$) were used as starting materials. As titanium oxide, Showa Denko's F-2 (specific surface area 30 m²/g) was used.

These starting materials are weighed so that the final composition of the piezoelectric ceramics obtained becomes $(Bi_{0.425}Na_{0.425}Ba_{0.15})(Ti_{0.982}Mn_{0.018})O_3$ and the total mass of the raw materials becomes 1 kg. Then the mixture was put into a pot having a volume of 5 L together with 6 kg of zirconia beads and 3 L of an ethanol-based solvent, and wet mixing was performed at 100 rpm for 16 hours.

The zirconia beads were separated from the mixed slurry, and the mixed powder obtained by removing the solvent with an evaporator was pre-fired in the air at 850° C. for 3 hours to obtain a pre-fired powder.

The obtained pre-fired powder was wet-crushed with a ball mill until no solidified coarse particles were observed, was mixed with an acrylic binder, and was uniaxially press-molded at a pressure of 2 tf to form a disk-shape molded product (molded body) having a diameter of 10 mm.

The obtained molded product (molded body) was fired in the air at 1080° C. for 2 hours to obtain the piezoelectric ceramic of this Working Example.

<Grain Size Measurements of Piezoelectric Ceramic>

For the obtained piezoelectric ceramic, the average grain size $r_{avg}$ and the coefficient of variation of the grain size C.V. were measured by the methods described above, which yielded: $r_{avg}$=3.8 µm, C.V.=29.7%.

<Manufacture of Test-Purpose Piezoelectric Device>

Electrodes was formed by applying an Ag paste to both sides of the above-mentioned disc-shaped piezoelectric ceramic, and by passing it through a belt furnace set at 800° C. to bake the paste.

The piezoelectric ceramic after the electrode formation was subjected to a poling treatment in silicon oil at 100° C. at an electric field strength of 6 kV/mm for 15 minutes to obtain a test-purpose piezoelectric device.

<Measurement of Area Ratio of Domain in Grain>

Figure 3:
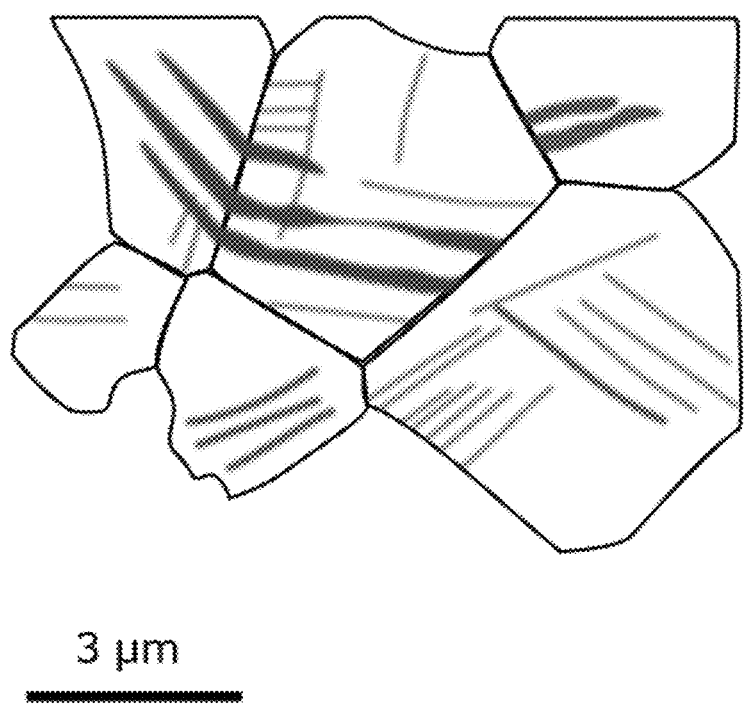
FIG. 3 is a schematic diagram showing the structure of domains observed in grains in a piezoelectric ceramics according to an embodiment of the present invention.

For the test-purpose piezoelectric device thus manufactured, 24 hours after the poling treatment, the area ratio of the domain in the grains in the piezoelectric ceramic constituting the piezoelectric device was determined by the method described above. A sketch of the IQ image used to determine the area ratio of the domain is shown in FIG. 3. The domain area ratios calculated for two grains with a grain size of 3 µm to 5 µm observed in the range of 10 µm×10 µm were 85% and 87%, respectively. Further, for adjacent grains in the observation region, the ratio of the distance between contacts (distance between $a_1$-$b_1$ and $a_2$-$b_2$ in FIG. 1) between the domain walls in the grains and the boundary between grains to the domain width (distance between $a_1$-$a_2$ and $b_1$-$b_2$ in FIG. 1) was calculated. It was found to be 13.3% at the maximum. From this, it was found that the test-purpose piezoelectric device according to the Working Example is a preferable embodiment of the present invention in which the domain is confirmed to straddle a plurality of adjacent grains.

<Measurement of Characteristics of Test-Purpose Piezoelectric Device>

The following measurements were performed on the test-purpose piezoelectric device 24 hours after the poling treatment.

Using an LCR meter, the capacitance C and the dielectric loss tangent tan δ were measured under the conditions of a frequency of 1 kHz and an OSC of 1 V. From the obtained value of the capacitance C and the dimensions of the test-purpose piezoelectric device, the relative permittivity $\varepsilon_{33}^{T}/\varepsilon_0$ of the element was calculated. As a result of the measurements, the relative permittivity $\varepsilon_{33}^{T}/\varepsilon_0$ was found to be 459, and the dielectric loss tangent tan δ was found to be 0.91%.

In addition, the relationship between frequency and impedance was measured using an impedance analyzer, and the mechanical quality factor Qm was calculated by the resonance-antiresonance method. As a result of the measurement, the mechanical quality factor Qm was found to be 1096.

Furthermore, the piezoelectric constant $d_{33}$ was measured using a $d_{33}$ meter (Berlincourt method). As a result of the measurement, the piezoelectric constant $d_{33}$ was found to be 95.2 pC/N.

Comparison Example

<Manufacture of Piezoelectric Ceramic of Comparison Example>

High-purity bismuth oxide ($Bi_2O_3$), sodium carbonate ($Na_2CO_3$), barium carbonate ($BaCO_3$), titanium oxide ($TiO_2$), and manganese carbonate ($MnCO_3$) were used as starting materials. As titanium oxide, CR-EL (specific surface area 6.5 m²/g) of Ishihara Sangyo was used.

These starting materials are weighed so that the final composition of the piezoelectric ceramics obtained becomes $(Bi_{0.425}Na_{0.425}Ba_{0.15})(Ti_{0.982}Mn_{0.018})O_3$ and the total mass of the raw materials becomes 1 kg. Then, 3 kg of zirconia beads and 3 L of an ethanol-based solvent were put into a pot having a volume of 5 L, and wet mixing was performed at 100 rpm for 16 hours.

Then, the zirconia beads were separated from the mixed slurry, and the mixed powder obtained by removing the solvent with an evaporator was pre-fired in the air at 840° C. for 3 hours to obtain a pre-fired powder.

The obtained pre-fired powder was wet-crushed with a ball mill until no coarse agglomerated particles were observed, was mixed with an acrylic binder, and was uniaxially press-molded at a pressure of 2 tf so as to form a disk-shaped molded body having a diameter of 10 mm.

The obtained molded body was fired in the air at 1030° C. for 2 hours to obtain a piezoelectric ceramic of the Comparison Example.

<Grain Size Measurement of Piezoelectric Ceramic of Comparison Example>

For the obtained piezoelectric ceramic of the Comparison Example, the average grain size $r_{avg}$ and the coefficient of variation of the grain size C.V. were determined by the same method as in the Working Example and were found to be: $r_{avg}$=2.9 μm, C.V.=35.4%, respectively.

<Manufacturing of Test-Purpose Piezoelectric Device of Comparison Example and Measurements of Characteristics>

The above-mentioned piezoelectric ceramic of the Comparison Example was subjected to the same processes as in the Working Example to obtain a test-purpose piezoelectric device of the Comparison Example.

Figure 4:
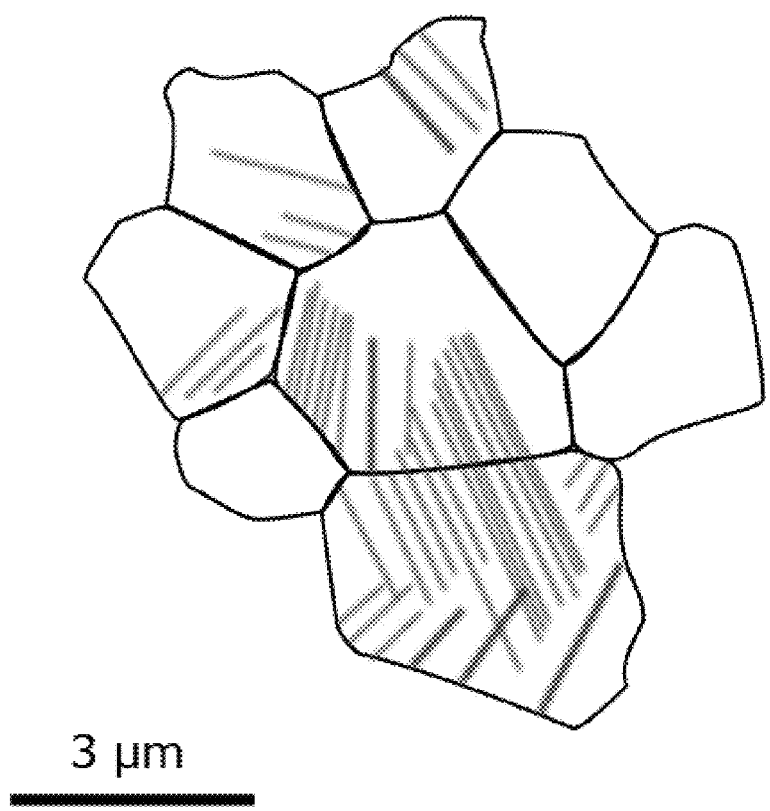
FIG. 4 is a schematic diagram showing the structure of the domain observed in grains in a piezoelectric ceramic of a comparison example.

For the thus obtained piezoelectric device, the area ratio of the domain in the grains was determined by the same method as in the Working Example. A sketch of the IQ image used to determine the area ratio of the domain is shown in FIG. 4. The domain area ratios calculated for two grains with a grain size of 3 μm to 5 μm observed in the range of 10 μm×10 μm were found to be 83% and 80%, respectively.

When the characteristics of the obtained test-purpose piezoelectric device of the Comparison Example were measured by the same methods as in the Working Example, the relative permittivity $\varepsilon_{33}^T/\varepsilon_0$ was found to be 539, the dielectric loss tangent tan δ was found to be 1.05%, the mechanical quality factor Qm was found to be 847, and the piezoelectric constant $d_{33}$ was found to be 98.4 pC/N.

The results of the Working Example and the Comparative Example are summarized in Table 1 below,

TABLE 1

| | Ceramic Grain Size | | Domain Area Ratio | | Piezoelectric Characteristics | | | |
|---|---|---|---|---|---|---|---|---|
| | Average | | | | | | | |
| | Grain size [μm] | C.V. [%] | Grain 1 [%] | Grain 2 [%] | tan δ [%] | $\varepsilon_{33}^T/\varepsilon_0$ | Qm | $d_{33}$ [pC/N] |
| Working Example | 3.8 | 29.7 | 85 | 87 | 0.91 | 459 | 1096 | 95.2 |
| Comparison Example | 2.9 | 35.4 | 83 | 80 | 1.05 | 539 | 847 | 98.4 |

As shown in Table 1, in the Working Example, the coefficient of variation of the grain size C.V. of the piezoelectric ceramic is smaller than that of the Comparison Example, the area ratio of the domain in the large-diameter grains is larger, and the value of the dielectric loss tangent tan δ is smaller while exhibiting the mechanical quality factor Qm equal to or higher than that of Comparison Example. From this result, it can be said that by making the coefficient of variation of the grain size C.V. small and increasing the domain size in the grains having a relatively large grain size, the dielectric loss tangent tan δ can be made small.

According to the present invention, it is possible to provide piezoelectric ceramics having an improved dielectric loss tangent tan δ while maintaining a high mechanical quality factor Qm. When such piezoelectric ceramics are used in an ultrasonic vibrator, the amount of heat generated during driving is suppressed as compared with conventional piezoelectric ceramics, and a high-performance and highly reliable device can be made. Therefore, the piezoelectric device provided with the piezoelectric ceramics of the present invention can be suitably used for an ultrasonic vibrator. Further, according to the present invention, piezoelectric ceramics having both a high mechanical quality factor Qm and a low dielectric loss tangent tan δ can be manufactured without going through a special process. Therefore, the present invention has an advantage that piezoelectric ceramics having excellent characteristics can be obtained while suppressing an increase in manufacturing cost.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A piezoelectric ceramic containing no lead as a constituent element,
    wherein coefficient of variation C.V. of grain size of grains contained in the piezoelectric ceramic is 35% or less, and
    wherein an image quality (IQ) image obtained by analyzing a cross section of the piezoelectric ceramic by an electron backscatter diffraction (EBSD) method shows that at least one of the grains has a grain size of 3 μm to 5 μm and an area ratio of a domain in said at least one of the grains is 85% or more.

2. The piezoelectric ceramic according to claim 1, wherein said image quality (IQ) image shows that said domain straddle two or more grains that are adjacent to each other in said IQ image.

3. The piezoelectric ceramic according to claim 1, wherein the piezoelectric ceramic has a perovskite compound represented by $(Bi_{0.5-x/2}Na_{0.5-x/2}Ba_x)(Ti_{1-y}Mn_y)O_3$, where 0.01≤x≤0.25 and 0.001≤y≤0.020, as a main component.

4. The piezoelectric ceramic according to claim 2, wherein the piezoelectric ceramic has a perovskite compound represented by $(Bi_{0.5-x/2}Na_{0.5-x/2}Ba_x)(Ti_{1-y}Mn_y)O_3$, where 0.01≤x≤0.25 and 0.001≤y≤0.020, as a main component.

5. A piezoelectric device, comprising:
    the piezoelectric ceramic as set forth in claim 1; and
    electrodes that are electrically connected to the piezoelectric ceramic.

6. A piezoelectric device, comprising:
    the piezoelectric ceramic as set forth in claim 2; and
    electrodes that are electrically connected to the piezoelectric ceramic.

7. A piezoelectric device, comprising:
the piezoelectric ceramic as set forth in claim 3; and
electrodes that are electrically connected to the piezoelectric ceramic.

8. A piezoelectric device, comprising:
the piezoelectric ceramic as set forth in claim 4; and
electrodes that are electrically connected to the piezoelectric ceramic.

9. A piezoelectric device, comprising:
a laminated body in which piezoelectric ceramic layers, each made of the piezoelectric ceramic as set forth in claim 1, and internal electrode layers are alternately laminated;
a pair of connecting conductors electrically connected respectively to the internal electrode layers every other layer alternately; and
a pair of surface electrodes provided on surfaces of the laminated body and electrically connected to the pair of connecting conductors, respectively.

10. A piezoelectric device, comprising:
a laminated body in which piezoelectric ceramic layers, each made of the piezoelectric ceramic as set forth in claim 2, and internal electrode layers are alternately laminated;
a pair of connecting conductors electrically connected respectively to the internal electrode layers every other layer alternately; and
a pair of surface electrodes provided on surfaces of the laminated body and electrically connected to the pair of connecting conductors, respectively.

11. A piezoelectric device, comprising:
a laminated body in which piezoelectric ceramic layers, each made of the piezoelectric ceramic as set forth in claim 3, and internal electrode layers are alternately laminated;
a pair of connecting conductors electrically connected respectively to the internal electrode layers every other layer alternately; and
a pair of surface electrodes provided on surfaces of the laminated body and electrically connected to the pair of connecting conductors, respectively.

12. A piezoelectric device, comprising:
a laminated body in which piezoelectric ceramic layers, each made of the piezoelectric ceramic as set forth in claim 4, and internal electrode layers are alternately laminated;
a pair of connecting conductors electrically connected respectively to the internal electrode layers every other layer alternately; and
a pair of surface electrodes provided on surfaces of the laminated body and electrically connected to the pair of connecting conductors, respectively.

* * * * *